(12) United States Patent
Lee et al.

(10) Patent No.: US 11,428,988 B2
(45) Date of Patent: Aug. 30, 2022

(54) INCREASING COLOR GAMUT PERFORMANCE AND EFFICIENCY IN QUANTUM DOT COLOR CONVERSION LAYERS

(71) Applicant: Nanosys, Inc., Milpitas, CA (US)

(72) Inventors: Ernest C. Lee, Palo Alto, CA (US); Ilan Jen-La Plante, San Jose, CA (US)

(73) Assignee: Nanosys, Inc., Milpitas, CA (US)

( * ) Notice: Subject to any disclaimer, the term of this patent is extended or adjusted under 35 U.S.C. 154(b) by 226 days.

(21) Appl. No.: 16/549,276

(22) Filed: Aug. 23, 2019

(65) Prior Publication Data

US 2020/0073178 A1 Mar. 5, 2020

Related U.S. Application Data

(60) Provisional application No. 62/725,689, filed on Aug. 31, 2018.

(51) Int. Cl.
*G02F 1/1335* (2006.01)
*H01L 33/06* (2010.01)
*G02F 1/13357* (2006.01)

(52) U.S. Cl.
CPC ........ *G02F 1/133617* (2013.01); *H01L 33/06* (2013.01)

(58) Field of Classification Search
CPC ......... G02F 1/133617; G02F 1/133614; G02F 1/133624; H01L 33/06; H01L 27/322; H01L 2251/5369
See application file for complete search history.

(56) References Cited

U.S. PATENT DOCUMENTS

| 8,283,412 | B2* | 10/2012 | Liu | C07D 303/24 524/588 |
| 10,935,842 | B2* | 3/2021 | Lee | G02F 1/133514 |
| 11,029,559 | B2* | 6/2021 | Lee | G02F 1/133606 |
| 11,092,850 | B2* | 8/2021 | Lee | G02F 1/133603 |
| 2014/0139791 | A1 | 5/2014 | Alberth, Jr. et al. | |

(Continued)

FOREIGN PATENT DOCUMENTS

EP    3163366 A1    5/2017

OTHER PUBLICATIONS

International search report PCTus2019048455 (dated 2021).*

(Continued)

*Primary Examiner* — Tracie Y Green
(74) *Attorney, Agent, or Firm* — Sterne, Kessler, Goldstein & Fox P.L.L.C.

(57) ABSTRACT

Embodiments of a display device are described. The display device includes a liquid crystal display (LCD) module and a backlight unit designed to emit a primary light in a first wavelength region of an electromagnetic (EM) spectrum. The LCD module includes an array of pixels having at least one pixel with a sub-pixel that includes a layer of luminescent nanostructures and a layer of fluorescent material. The layer of luminescent nanostructures absorbs the primary light and emits a second light in a second wavelength region of the EM spectrum different from the first wavelength region. The layer of fluorescent material absorbs the primary light that has passed through the layer of luminescent nanostructures, and emits a third light in the second wavelength region of the EM spectrum.

17 Claims, 5 Drawing Sheets

(56) References Cited

U.S. PATENT DOCUMENTS

| | | | |
|---|---|---|---|
| 2016/0033823 A1* | 2/2016 | Lee | G02F 1/133617 |
| | | | 349/71 |
| 2016/0223162 A1 | 8/2016 | Shin et al. | |
| 2017/0255054 A1* | 9/2017 | Li | G02F 1/133617 |
| 2017/0260212 A1 | 9/2017 | Lee et al. | |
| 2017/0267921 A1 | 9/2017 | Shin et al. | |
| 2018/0081243 A1* | 3/2018 | Lim | C09K 19/56 |
| 2018/0120647 A1* | 5/2018 | Suh | G02F 1/133617 |
| 2019/0064603 A1* | 2/2019 | Lee | G02F 1/133514 |
| 2020/0033527 A1* | 1/2020 | Lee | G02B 6/0053 |
| 2020/0057338 A1* | 2/2020 | Lee | G02F 1/133528 |

OTHER PUBLICATIONS

International Search Report and Written Opinion, for PCT App. No. PCT/US2019/048455, filed Aug. 28, 2019, 11 pages, dated Nov. 19, 2019.

\* cited by examiner

INCREASING COLOR GAMUT PERFORMANCE AND EFFICIENCY IN QUANTUM DOT COLOR CONVERSION LAYERS

CROSS REFERENCE TO RELATED APPLICATIONS

This application incorporates by reference in their entirety U.S. Provisional Appl. No. 62/725,689, filed Aug. 31, 2018.

BACKGROUND OF THE INVENTION

Field

The present invention relates to display devices including phosphor films having luminescent nanostructures such as quantum dots (QDs).

Background

Luminescent nanostructures (NSs) such as quantum dots (QDs) represent a class of phosphors that have the ability to emit light at a single spectral peak with narrow line width, creating highly saturated colors. It is possible to tune the emission wavelength based on the size of the NSs. The NSs are used to produce a NS film that may be used as a color down conversion layer in display devices (e.g., liquid crystal display (LCD) device, organic light emitting diode (OLED) display device). The use of a color down conversion layer in emissive displays can improve the system efficiency by down-converting white light, blue light, or ultra-violet (UV) light to a more reddish light, greenish light, or both before the light passes through a color filter. This use of a color down conversion layer may reduce loss of light energy due to filtering or even eliminate the need for additional filtering entirely.

Figure 1:
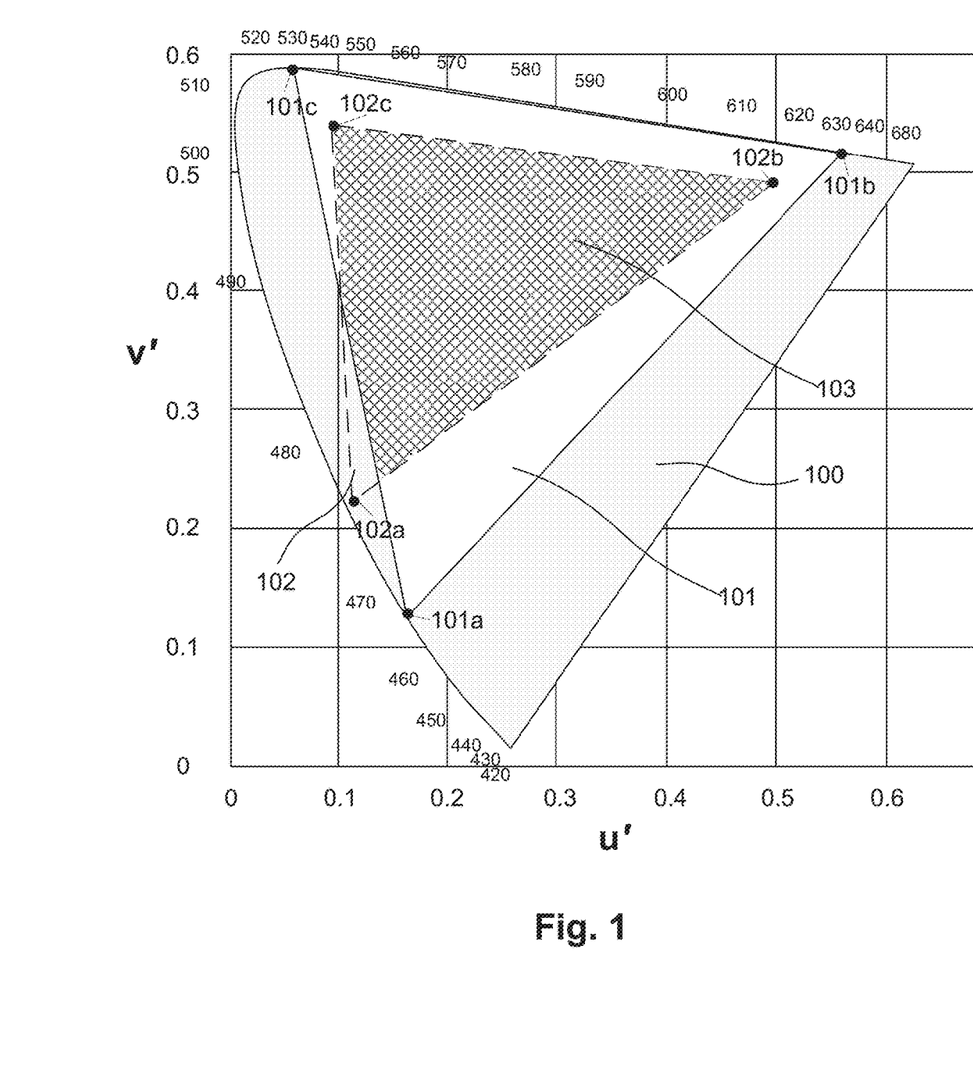
FIG. 1 is a CIE 1976 u'v' chromaticity diagram of Rec. 2020 color gamut and a color gamut of a display device.

One of the factors used to define the image quality of a display device is the color gamut coverage of standard RGB color spaces such as Rec. 2020, Rec. 709, DCI P3, NTSC, or sRGB provided by the display device. FIG. 1 illustrates a definition of color gamut coverage of a display device. In FIG. 1, area 101 formed between 1976 CIE color coordinates 101a-101c represents the color gamut of a standard RGB color space (e.g., Rec. 2020) on the 1976 CIE u'-v' chromaticity diagram 100. Area 102 formed between 1976 CIE color coordinates 102a-102c represents the color gamut of the display device on the 1976 CIE u'-v' chromaticity diagram 100. Color gamut coverage of the display device may be defined as a ratio of the overlapping area 103 between areas 101 and 102 to area 101. The wider the color gamut coverage of a display device, the wider is the range of colors identifiable by the human eye (i.e., the visible spectrum) rendered by the display device, and hence, improves the image quality of the display device assuming the other factors contributing to the image quality are optimized.

The color gamut of a display device may be defined by the color coordinates of the individual sub-pixels. In a display device utilizing color down conversion layers, there is typically a single color light source. The blue sub-pixel consists of this source light while the green and red sub-pixels have color down conversion layers that convert this source (or excitation) light into green and red light, respectively.

In order to optimize the color gamut coverage of a display device using color down conversion layers, the amount of excitation light transmitting through the color conversion layer may need to be minimized, if not eliminated entirely. This can be difficult in a thin (about 3-10 micron) layer using a NS film due to its limited optical density in such a layer. Filters can be added to absorb any remaining blue light that has passed through green and/or red conversion material, but optical efficiency is degraded as the filters do not transmit the green and/or red light with perfect efficiency.

SUMMARY

Accordingly, there is need for display devices with improved color gamut coverage and an improved optical efficiency of the down-conversion layers for producing red and green light. Embodiments herein describe the use of a dye that can both absorb remaining blue light that leaks through the down-conversion layers, and also emit useful wavelengths of light similar to the light emitted by the down-conversion layers.

According to an embodiment, a display device includes a liquid crystal display (LCD) module and a backlight unit designed to emit a primary light in a first wavelength region of an electromagnetic (EM) spectrum. The LCD module includes an array of pixels having at least one pixel with a sub-pixel that includes a layer of luminescent nanostructures and a layer of fluorescent material. The layer of luminescent nanostructures absorbs the primary light and emits a second light in a second wavelength region of the EM spectrum different from the first wavelength region. The layer of fluorescent material absorbs the primary light that has passed through the layer of luminescent nanostructures, and emits a third light in the second wavelength region of the EM spectrum.

According to an embodiment, a luminescent device includes a light source, a first film including luminescent nanostructures, and a second film including fluorescent material. The light source is designed to emit a primary light in a first wavelength region of an electromagnetic (EM) spectrum. The first film is designed to absorb the primary light and emit a second light in a second wavelength region of the EM spectrum different from the first wavelength region. The second film is disposed on the first film and is designed to absorb the primary light that has passed through the first film, and to emit a third light in the second wavelength region of the EM spectrum.

According to an embodiment, a display device includes an array of pixels. A pixel of the array includes a sub-pixel that includes a layer of luminescent nanostructures and a layer of fluorescent material. The layer of luminescent nanostructures absorbs the primary light and emits a second light in a second wavelength region of the EM spectrum different from the first wavelength region. The layer of fluorescent material absorbs the primary light that has passed through the layer of luminescent nanostructures, and emits a third light in the second wavelength region of the EM spectrum.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present embodiments and, together with the description, further serve to explain the principles of the present embodiments and to enable a person skilled in the relevant art(s) to make and use the present embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION OF THE INVENTION

Although specific configurations and arrangements may be discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications beyond those specifically mentioned herein. It should be appreciated that the particular implementations shown and described herein are examples and are not intended to otherwise limit the scope of the application in any way.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

All numbers in this description indicating amounts, ratios of materials, physical properties of materials, and/or use are to be understood as modified by the word "about," except as otherwise explicitly indicated.

In embodiments, the term "display device" refers to an arrangement of elements that allow for the visible representation of data on a display screen. Suitable display screens may include various flat, curved or otherwise-shaped screens, films, sheets or other structures for displaying information visually to a user. Display devices described herein may be included in, for example, display systems encompassing a liquid crystal display (LCD), televisions, computers, mobile phones, smart phones, personal digital assistants (PDAs), gaming devices, electronic reading devices, digital cameras, tablets, wearable devices, car navigation systems, and the like.

The term "about" as used herein indicates the value of a given quantity varies by ±10% of the value. For example, "about 100 nm" encompasses a range of sizes from 90 nm to 110 nm, inclusive.

The term "substantially" as used herein indicates the value of a given quantity varies by ±1% to ±5% of the value.

In embodiments, the term "forming a reaction mixture" or "forming a mixture" refers to combining at least two components in a container under conditions suitable for the components to react with one another and form a third component.

In embodiment, the terms "light guide plate," "light guide," and "light guide panel" are used interchangeably and refer to an optical component that is suitable for directing electromagnetic radiation (light) from one position to another.

In embodiments, the term "optically coupled" means that components are positioned such that light is able to pass from one component to another component without substantial interference.

The term "nanostructure" as used herein refers to a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, QDs, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "QD" or "nanocrystal" as used herein refers to nanostructures that are substantially monocrystalline. A nanocrystal has at least one region or characteristic dimension with a dimension of less than about 500 nm, and down to the order of less than about 1 nm. The terms "nanocrystal," "QD," "nanodot," and "dot," are readily understood by the ordinarily skilled artisan to represent like structures and are used herein interchangeably. The present invention also encompasses the use of polycrystalline or amorphous nanocrystals.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can but need not completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the term "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

The term "ligand" as used herein refers to a molecule capable of interacting (whether weakly or strongly) with one or more faces of a nanostructure, e.g., through covalent, ionic, van der Waals, or other molecular interactions with the surface of the nanostructure.

The term "quantum yield" (QY) as used herein refers to the ratio of photons emitted to photons absorbed, e.g., by a nanostructure or population of nanostructures. As known in the art, quantum yield is typically determined by a comparative method using well-characterized standard samples with known quantum yield values.

The term "primary emission peak wavelength" as used herein refers to the wavelength at which the emission spectrum exhibits the highest intensity.

The term "full width at half-maximum" (FWHM) as used herein refers to refers to a measure of spectral width. In the case of an emission spectrum, a FWHM can refer to a width of the emission spectrum at half of a peak intensity value.

The term Forster radius used herein is also referred as Forster distance in the art.

The terms "luminance" and "brightness" are used herein interchangeably and refer to a photometric measure of a luminous intensity per unit area of a light source or an illuminated surface.

The terms "specular reflectors," "specularly reflective surfaces," and "reflective surfaces" are used herein to refer to elements, materials, and/or surfaces capable of specular reflection.

The term "specular reflection" is used herein to refer to a mirror-like reflection of light (or of other kinds of wave) from a surface, when an incident light hits the surface.

The term "nanostructure (NS) film" is used herein to refer to a film having luminescent nanostructures.

The term "red sub-pixel" is used herein to refer to an area of a pixel that emits light having a primary emission peak wavelength in the red wavelength region of the visible spectrum. In some embodiments, the red wavelength region may include wavelengths ranging from about 620 nm to about 750 nm.

The term "green sub-pixel" is used herein to refer to an area of a pixel that emits light having a primary emission peak wavelength in the green wavelength region of the visible spectrum. In some embodiments, the green wavelength region may include wavelengths ranging from about 495 nm to about 570 nm.

The term "blue sub-pixel" is used herein to refer to an area of a pixel that emits light having a primary emission peak wavelength in the blue wavelength region of the visible spectrum. In some embodiments, the blue wavelength region may include wavelengths ranging from about 435 nm to about 495 nm.

The term "emissive surface of a sub-pixel" is used herein to refer to a surface of a topmost layer of the sub-pixel from which light is emitted towards a display screen of a display device.

The published patents, patent applications, websites, company names, and scientific literature referred to herein are hereby incorporated by reference in their entirety to the same extent as if each was specifically and individually indicated to be incorporated by reference. Any conflict between any reference cited herein and the specific teachings of this specification shall be resolved in favor of the latter. Likewise, any conflict between an art-understood definition of a word or phrase and a definition of the word or phrase as specifically taught in this specification shall be resolved in favor of the latter.

Technical and scientific terms used herein have the meaning commonly understood by one of skill in the art to which the present application pertains, unless otherwise defined. Reference is made herein to various methodologies and materials known to those of skill in the art.

Overview

This disclosure provides various embodiments of nanostructure-based display devices that help to improve or eliminate existing trade-offs between achieving the desired brightness and the desired color gamut in display devices. These various embodiments also help to improve display performance such as color gamut coverage of the nanostructure-based display devices by reducing or substantially eliminating leakage of unwanted light through one or more pixels of the display devices, while enhancing the desired light output of the same one or more pixels. Although specific embodiments herein are described with regards to a LCD device, this is not intended to be limiting, and a person skilled in the art would recognize that the components discussed herein can be used in any illuminating device.

Example Embodiments of a Liquid Crystal Display (LCD) Device

Figure 2:
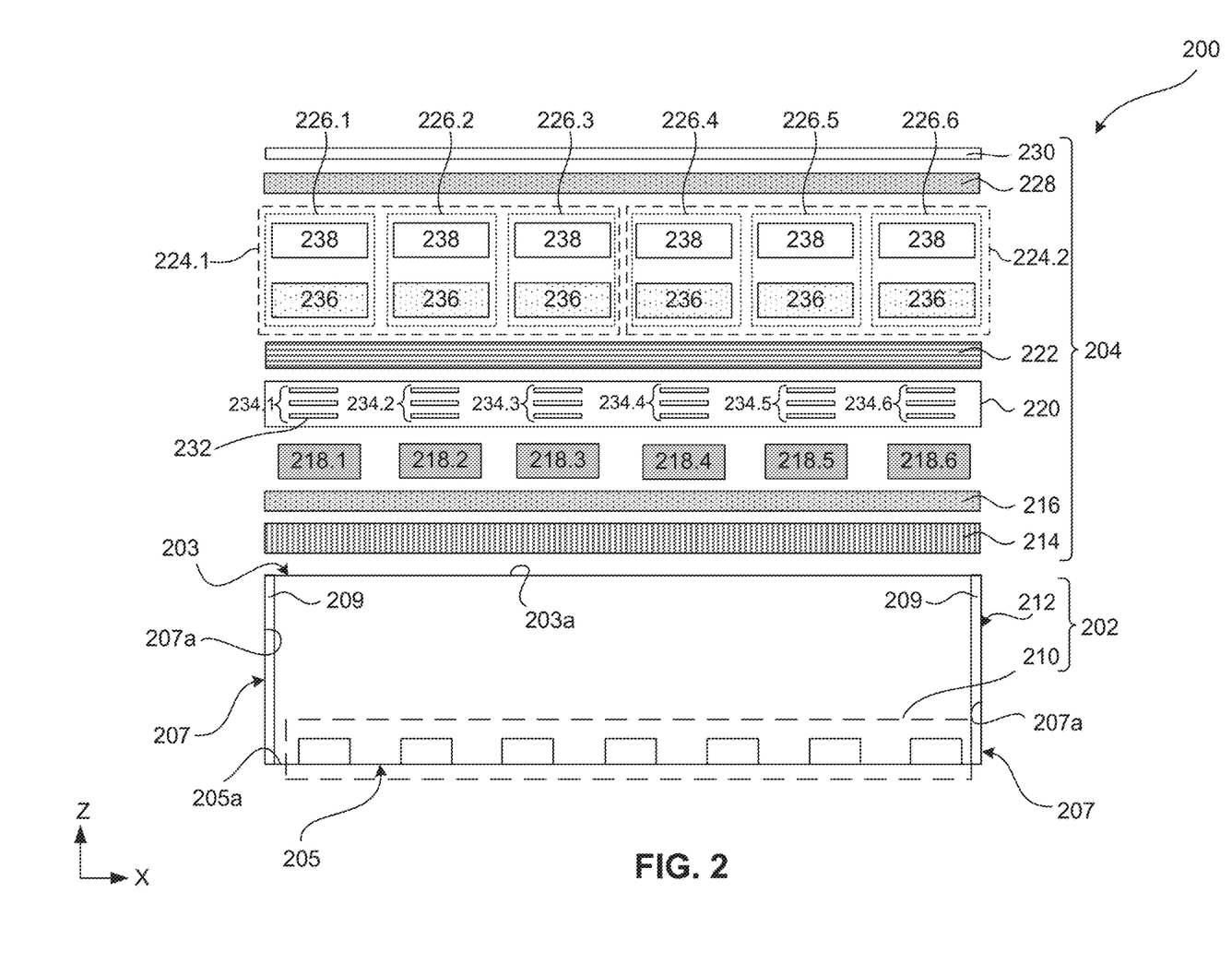
FIGS. 2-3 are exploded cross-sectional views of liquid crystal display (LCD) devices, according to an embodiment.

FIG. 2 illustrates a schematic of an exploded cross-sectional view of an LCD display device 200, according to an embodiment. A person of ordinary skill in the art will recognize that the view of display device in FIG. 2 is shown for illustration purposes and may not be drawn to scale. LCD display device 200 can include a backlight unit (BLU) 202 and an LCD module 204, according to an embodiment.

BLU 202 can include an optical cavity 212 and an array of light emitting diodes (LEDs) 210 (e.g., white LEDs, blue LEDs, UV LEDs or a combination thereof) coupled to optical cavity 212. In an embodiment, LEDs 210 only include blue LEDs and UV LEDs in a given ratio. Optical cavity 212 can include a top side 203, a bottom side 205, sidewalls 207, and a closed volume confined by top side 203, bottom side 205, and sidewalls 207. LEDs 210 can be coupled to a top surface 205a of bottom side 205 within the closed volume. LEDs 210 can be configured to provide a primary light (e.g., blue light, white light, UV light, or a combination of blue light and UV light) that may be processed through LCD module 204 and subsequently, transmitted to and distributed across a display screen 230 of LCD display device 200. In some embodiments, LEDs 210 comprise blue LEDs that emit light having a peak emission wavelength between about 440 nm and about 470 nm, or between about 445 nm and about 455 nm. In some embodiments, LEDs 210 comprise white LEDs that emit light in the range from about 440 nm to about 700 nm or other possible light wavelength ranges. In some embodiments, LEDs 210 comprise UV LEDs that emit light having a peak emission wavelength that is less than 420 nm, or that is between about 400 nm and about 410 nm, or that is between about 360 nm and about 370 nm. In an embodiment, the array of LEDs 210 can comprise a two-dimensional array of LEDs that are spread across an area of top surface 205a and the area may be equal to the surface area of display screen 230.

It should be noted that even though two sidewalls 207 are shown in FIG. 2, a person skilled in the art would understand that optical cavity 212 can include any number of sidewalls 207, according to various embodiments. For example, optical cavity 212 can have a cuboid shape and may include four sidewalls similar to sidewalls 207. Optical cavity 212 is not restricted to being cuboid in shape or having other straight-sided shapes. Optical cavity 212 can be configured to be any type of geometric shape, such as but not limited to cylindrical, trapezoidal, spherical, or elliptical, according to various embodiments, without departing from the spirit and scope of the present invention. It should also be noted that the rectangular cross-sectional shape of optical cavity 212, as illustrated in FIG. 2, is for illustrative purposes, and is not limiting. Optical cavity 212 can have other cross-sectional shapes (e.g., trapezoid, oblong, rhomboid), according to various embodiments, without departing from the spirit and scope of the present invention.

Top side 203 of optical cavity 212 can be configured to be an optically diffusive and transmissive layer such that light from LEDs 210 can exit optical cavity 212 through top side 203 with a substantially uniform distribution of brightness across top surface 203a of top side 203. In an embodiment, top side 203 can include optically transparent areas and optically translucent areas that are strategically arranged over LEDs 210 to provide the substantially uniform distribution in light brightness exiting top side 203. In another embodiment, top side 203 can include pores of varying sizes in diameters and optically translucent areas that are strategically arranged to provide the substantially uniform distribution in light brightness exiting top side 203.

Bottom side 205 and/or sidewalls 207 can be constructed from one or more materials (e.g., metals, non-metals, and/or alloys) that are configured to have specularly reflective top surface 205a and/or specularly reflective side wall interior surfaces 207a, respectively. For example, top surface 205a and/or side wall interior surfaces 207a can be mirror-like surfaces having mirror-like reflection properties. In some embodiments, top surface 205a and/or side wall interior surfaces 207a can be completely specularly reflective or partially specularly reflective and partially scattering. In some other embodiments, top surface 205a and/or side wall interior surfaces 207a include diffuse reflectors.

In alternate embodiments, optical cavity 212 can include specular reflectors 209 coupled to sidewall interior surfaces 207a. Specular reflectors 209 can be coupled to sidewall interior surfaces 207a using optically transparent adhesive. The optically transparent adhesive may comprise tape, various glues, polymeric compositions such as silicones, etc. Additional optically transparent adhesive may include various polymers, including, but not limited to, poly(vinyl butyral), poly(vinyl acetate), epoxies, and urethanes; silicone and derivatives of silicone, including, but not limited to, polyphenylmethylsiloxane, polyphenylalkylsiloxane, polydiphenylsiloxane, polydialkylsiloxane, fluorinated silicones and vinyl and hydride substituted silicones; acrylic polymers and copolymers formed from monomers including, but not limited to, methylmethacrylate, butylmethacrylate, and laurylmethacrylate; styrene based polymers; and polymers that are cross linked with difunctional monomers, such as divinylbenzene, according to various examples.

Specularly reflective top surface 205a and side wall interior surfaces 207a and specular reflectors 209 can substantially minimize absorption of light from LEDs 210 through bottom side 205 and/or side walls 207 and thus, substantially minimize loss of luminance within optical cavity 212 and increase light output efficiency of BLU 202.

In alternate embodiments, BLU 202 can further include one or more brightness enhancement films (BEFs) (not shown) disposed between optical cavity 212 and LCD module 204. The one or more BEFs can have reflective and/or refractive films, reflective polarizer films, light extraction features, light recycling features, prism films, groove films, grooved prism films, prisms, pitches, grooves, or other suitable brightness enhancement features. The brightness-enhancing features of BEFs can be configured to reflect a portion of the primary light back toward optical cavity 212, thereby providing recycling of the primary light.

LCD module 204 can be configured to process the light received from BLU 202 to desired characteristics for transmission to and distribution across display screen 230. In some embodiments, LCD module 204 can include one or more polarizing filters, such as first and second polarizing filters 214 and 222, one or more optically transparent substrates such as first and second optically transparent substrates 216 and 228, switching devices 218.1 through 218.6 arranged in a 2-D array on first substrate 216, a liquid crystal (LC) solution layer 220, a plurality of pixels such as pixels 224.1 and 224.2 arranged in a 2-D array, and display screen 230.

In some embodiments, pixel 224.1 can include sub-pixels 226.1 through 226.3 and pixel 224.2 can include sub-pixels 226.4 through 226.6. In some embodiments, each of pixels 224.1 and 224.2 can be tri-chromatic, for example, having red sub-pixels 226.1 and 226.4, green sub-pixels 226.2 and 226.5, and blue sub-pixels 226.3 and 226.6, respectively.

The term "red sub-pixel" is used herein to refer to an area of a pixel that emits light having a primary emission peak wavelength in the red wavelength region of the visible spectrum. In some embodiments, the red wavelength region may include wavelengths ranging from about 620 nm to about 750 nm. The term "green sub-pixel" is used herein to refer to an area of a pixel that emits light having a primary emission peak wavelength in the green wavelength region of the visible spectrum. In some embodiments, the green wavelength region may include wavelengths ranging from about 495 nm to about 570 nm. The term "blue sub-pixel" is used herein to refer to an area of a pixel that emits light having a primary emission peak wavelength in the blue wavelength region of the visible spectrum. In some embodiments, the blue wavelength region may include wavelengths ranging from about 435 nm to about 495 nm.

The arrangement order of red, green, and blue sub-pixels 226.1 through 226.6 in respective pixels 224.1 and 224.2 is illustrative and is not limiting. The red, green, and blue sub-pixels in each of pixels 224.1 and 224.2 can be arranged in any order with respect to each other. In some embodiments, pixels 224.1 and/or 224.2 can be monochromatic having either red, green, or blue sub-pixels 226.1 through 226.6. The number of pixels and switching devices shown in FIG. 2 are illustrative and are not limiting. LCD module 204 can have any number of switching devices and pixels without departing from the spirit and scope of this disclosure.

Light from BLU 202 can be polarized through first polarizing filter 214 and the polarized light may be transmitted to LC solution layer 220. LC solution layer 220 can include LCs 232 having rod-shaped molecules that may act as shutters to control the amount of light transmission from LC solution layer 220. In some embodiments, LCs 232 can be arranged in a 3-D array. Columns 234.1 through 234.6 of the 3-D array of LCs may be independently controlled by respective switching devices 218.1 through 218.6. In some embodiments, switching devices 218.1 through 218.6 can comprise transistors, such as, for example, thin film transistors (TFTs). By controlling LCs 232, the amount of light travelling from columns 234.1 through 234.6 to respective sub-pixels 226.1 through 226.6 can be controlled, and consequently, the amount of light transmitting from sub-pixels 226.1 through 226.6 is controlled.

LCs 232 can be twisted to varying degrees depending on the voltage applied to columns 234.1 through 234.6 by respective switching devices 218.1 through 218.6. By controlling the twisting of LCs 232, the polarization angle of light passing through LC solution layer 220 can be controlled. Light leaving LC solution layer 220 can then pass through second polarizing filter 222 that may be positioned at 90 degrees with respect to first polarizing filter 214. The angle of polarization of the light leaving LC solution layer 220 and entering second polarizing filter 222 can determine how much of the light is able to pass through and exit from second polarizing filter 222. Second polarizing filter 222 can attenuate the light, block the light, or allow the light to pass without attenuation based on its angle of polarization.

Portions of light travelling through columns 234.1 through 234.6 of LCs and exiting out of second polarizing filter 222 can then enter respective ones of sub-pixels 226.1 through 226.6. These portions of light may undergo a stage of color filtering through the respective ones of sub-pixels 226.1 through 226.6 to achieve the desired optical characteristics for light distribution across display screen 230. In some embodiments, each of sub-pixels 226.1 through 226.6 can include a layer (or film) of luminescent nanostructures 236 that may include elements that down-convert portions of the received light entering sub-pixels 226.1 through 226.6.

Luminescent nanostructures 236 can include nanostructures such as QDs (e.g., QD 600 described with reference to FIG. 6), according to some embodiments. Luminescent nanostructures 236 can be down-converters, where the portions of light (also referred as primary light) entering the respective ones of sub-pixels 226.1 through 226.6 can be absorbed, for example, by luminescent nanostructures 236 and re-emitted as secondary light having a lower energy or longer wavelength than the primary light.

In some embodiments, luminescent nanostructures 236 of red sub-pixels 226.1 and 226.4 can include nanostructures that absorb the primary light and emit a first secondary light having a primary emission peak wavelength in the red wavelength region of the visible spectrum light. In some embodiments, luminescent nanostructures 236 of green sub-pixels 226.2 and 226.5 can include nanostructures that absorb the primary light and emit a second secondary light having a primary emission peak wavelength in the green wavelength region of the visible spectrum light. In some embodiments, luminescent nanostructures 236 of blue sub-pixels 226.3 and 226.6 can include luminescent nanostructures that absorb the primary light and emit a third secondary light having a primary emission peak wavelength in the blue wavelength region of the visible spectrum light.

In some embodiments, blue sub-pixels 226.3 and 226.6 can not include luminescent nanostructures 236, or may have no film present at all. In some other embodiments, blue sub-pixels 226.3 and 226.6 include a scattering material instead of luminescent nanostructures 236. A layer or film may instead be present that excludes the luminescent nanostructures and may be optically transmissive to blue light when BLU 202 includes blue LEDs, as there is no need for down-conversion of primary light from the blue LEDs for blue sub-pixels 226.3 and 226.6.

In some embodiments, luminescent nanostructures 236 can be included in segmented films that are placed adjacent to each other on second polarizing filter 222 or on an optically transparent substrate (not shown). The segmented luminescent nanostructures 236 can be placed in a manner such that there is negligible gap at interfaces between adjacent luminescent nanostructures 236 to prevent leakage of primary light through the interfaces. In alternate embodiments, each of luminescent nanostructures 236 can be different regions of a continuous phosphor film.

According to some embodiments, each of sub-pixels 226.1 through 226.6 can include a fluorescent layer 238 disposed directly on or over luminescent nanostructures 236. The secondary light emitting from luminescent nanostructures 236 can be filtered through corresponding ones of fluorescent layers 238 before travelling to display screen 230.

Fluorescent layers 238 can be configured to allow substantially all of the secondary light (e.g., first, second, and/or third secondary light discussed above) to pass through and to block portions of the primary light (e.g., blue light or UV light) that are not absorbed by luminescent nanostructures 236 and down-converted to the secondary light. The unwanted portions of primary light that may have leaked out of luminescent nanostructures 236 can be blocked by absorbing. Leakage of the unconverted primary light from luminescent nanostructures 236 to display screen 230 can adversely affect the color gamut coverage of LCD display device 200. Additionally, fluorescent layers 238 can be configured to emit light matching (or substantially matching) the same light emitted from luminescent nanostructures 236. For example, for red sub-pixels 226.1 and 226.4, fluorescent layers 238 can be configured to absorb stray primary light (e.g., blue light or UV light) and emit light in the same wavelength range as the first secondary light emitted by luminescent nanostructures 236 in red sub-pixels 226.1 and 226.4. Similarly, for green sub-pixels 226.2 and 226.5, fluorescent layers 238 can be configured to absorb stray primary light (e.g., blue light or UV light) and emit light in the same wavelength range as the second secondary light emitted by luminescent nanostructures 236 in green sub-pixels 226.2 and 226.5. In some embodiments, fluorescent layers 238 used in blue sub-pixels 226.3 and 226.6, to absorb stray UV primary light and emit light in the same wavelength range as the third secondary light emitted by luminescent nanostructures 236 in blue sub-pixels 226.3 and 226.6. In some embodiments where blue light is used as the primary light, fluorescent layers 238 are not used for blue sub-pixels 226.3 and 226.6.

The use of fluorescent layers 238 to prevent primary light leakage through corresponding sub-pixels may also help to reduce the manufacturing cost of LCD display device 200 by reducing the density of luminescent nanostructures 236. The density of luminescent nanostructures 236 can be reduced since luminescent nanostructures 236 are no longer required to absorb substantially all portions of the primary light. In other words, any portions of primary light not absorbed by luminescent nanostructures 236 (especially for the red and green sub-pixels) may instead be absorbed by fluorescent layers 238. Additionally, the optical efficiency can be simultaneously improved because fluorescent layers 238 also emit matching red or green light to correspond with the red or green sub-pixel.

Fluorescent layers 238 can include a dye material. One example dye is the organic dye BODIPY® 493/503 (4,4-Difluoro-1,3,5,7,8-Pentamethyl-4-Bora-3a,4a-Diaza-s-Indacene; manufactured by Thermo Fisher Scientific), which absorbs light in the blue portion of the EM spectrum (for example at 450 nm) and has a peak emission in the green portion of the EM spectrum (for example between 510 nm and 535 nm.) The peak emission wavelength of the BODIPY 493/503 dye can be tuned based on the density of the dye present in fluorescent layers 238. This tuning of the emission spectrum can be used to affect overall optical properties of the corresponding sub-pixel, including peak emission wavelength, linewidth, and quantum yield. Due to its emission of green light, BODIPY 493/503 could be used as fluorescent layer 238 in green sub-pixels 226.2 and 226.5, according to an embodiment. Other similar dyes that absorb blue light and emit red light may be used for fluorescent layers 238 in red sub-pixels 226.1 and 226.4.

Fluorescent layers 238 can be disposed on layers of luminescent nanostructures 236 or any other layer/structure of LCD display device 200. In addition to dyes, fluorescent layers 238 can be any ink, paint, polymeric material, or any other material that can be sprayed, painted, spin-coated or printed. Printing may be done using, for example, a plotter, an inkjet printer, or a screen printer. Fluorescent layers 238 can be deposited to a thickness less than 10 μm, less than 5 μm, or between 1 μm and 2 μm. In some embodiments, fluorescent layers 238 can be directly disposed on the layers of luminescent nanostructures 236. In some embodiments, fluorescent layers 238 can include a substrate having fluorescent material disposed on it.

In some embodiments, fluorescent layers 238 can be segmented films that are cast separately and placed adjacent to each other over the layers of luminescent nanostructures 236 or on an optically transparent substrate (not shown). The segmented fluorescent layers 238 can be placed in a manner such that there is negligible gap at interfaces between adjacent fluorescent layers 238. In alternate embodiments, each of fluorescent layers 238 can be different regions of a continuous film placed or deposited over the layers of luminescent nanostructures 236.

In some embodiments, the fluorescent material may be included in optically transparent substrate 228, which may also be configured to provide environmental sealing to the underlying layers and/or structures of LCD module 204 and/or BLU 202.

Display screen 230 can be configured to generate images. Display screen 230 can be a touch screen display, according to an embodiment. LCD display device 200 can further include one or more medium materials (not shown) disposed between any of the adjacent elements in LCD display device 200, for example between optical cavity 212 and LCD module 204, on either sides of LC solution layer 220, or between any other elements of LCD display device 200. The one or more medium materials may include, but not limited to, substrates, a vacuum, air, gas, optical materials, adhesives, optical adhesives, glass, polymers, solids, liquids, gels, cured materials, optical coupling materials, index-matching or index-mismatching materials, index-gradient materials, cladding or anti-cladding materials, spacers, epoxy, silica gel, silicones, brightness-enhancing materials, scattering or diffuser materials, reflective or anti-reflective materials, wavelength-selective materials, wavelength-selective anti-reflective materials, or other suitable medium material. Suitable materials may include silicones, silicone gels, silica gel, epoxies (e.g., Loctite™ Epoxy E-30CL), acrylates (e.g., 3M™ Adhesive 2175). The one or more medium materials may be applied as a curable gel or liquid and cured during or after deposition, or pre-formed and pre-cured prior to deposition. Curing methods may include UV curing, thermal curing, chemical curing, or other suitable curing methods known in the art. Index-matching medium materials may be chosen to minimize optical losses between elements of BLU 202 and LCD module 204.

LCD display device 200 can have a geometric shape, such as but not limited to cylindrical, trapezoidal, spherical, or elliptical, according to various embodiments, without departing from the spirit and scope of the present invention. LCD display device 200 is not restricted to being cuboid in shape or having other straight-sided shapes. It should be noted that the rectangular cross-sectional shape of LCD display device 200 is for illustrative purposes, and is not limiting. LCD display device 200 can have other cross-sectional shapes (e.g., trapezoid, oblong, rhomboid), according to various embodiments, without departing from the spirit and scope of the present invention. It should also be noted that even though optical cavity 212, substrates 216 and 228, polarizing filter 214 and 222, and display screen 230 are shown in FIG. 2 to have similar dimensions along X-axis, a person skilled in the art would understand that each of these components may have dimensions different from each other in one or more directions, according to various embodiments.

Figure 3:
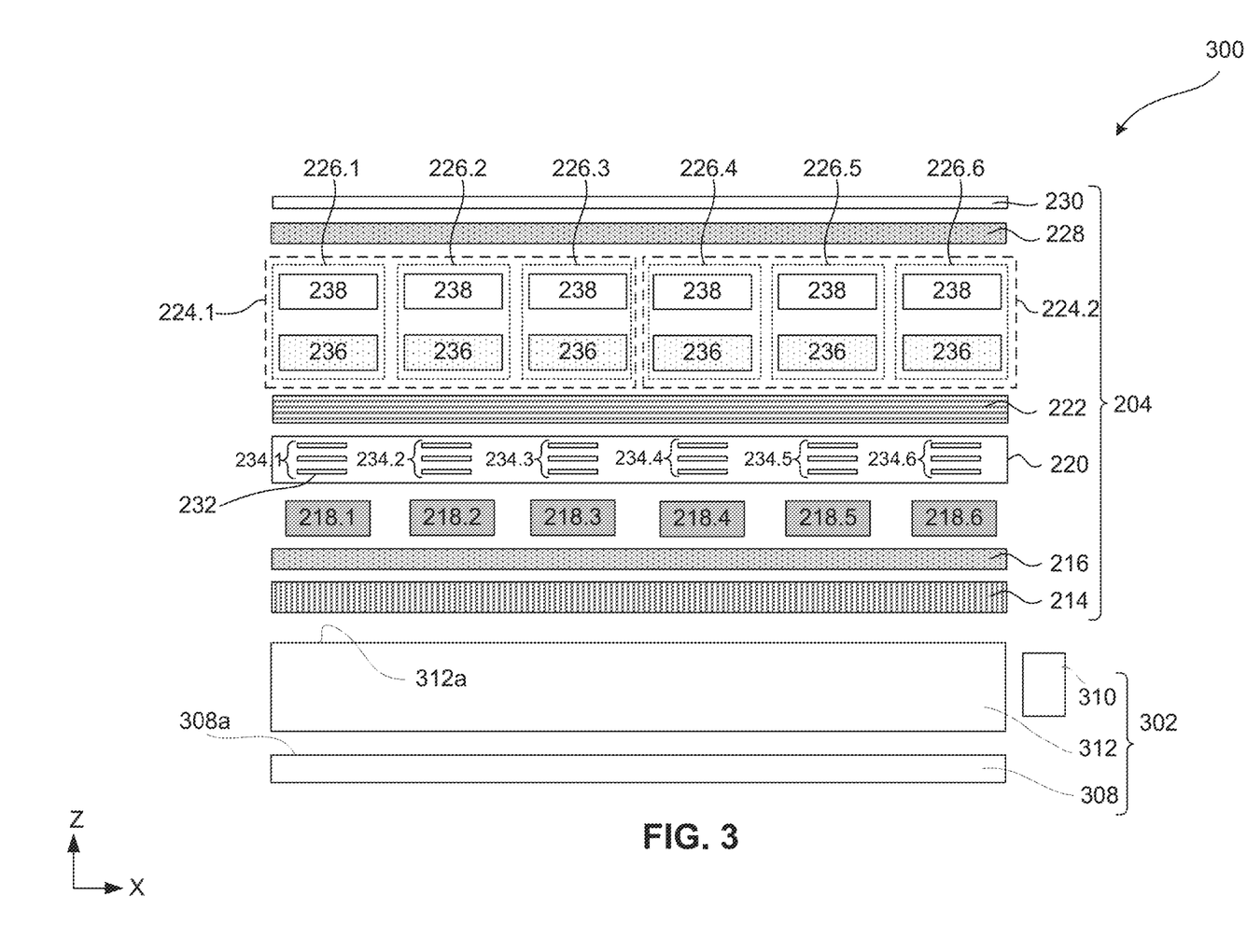

FIG. 3 illustrates a schematic of an exploded cross-sectional view of an edge-lit LCD display device 300, according to an embodiment. LCD display device 300 can include a BLU 302 and LCD module 204. Elements in FIG. 3 with the same annotations as elements in FIG. 2 are described above.

BLU 302 can include an edge-array of LEDs 310 (e.g., blue LEDs, white LEDs, or UV LEDs), a light guide plate (LGP) 312, and a reflector 308. BLU 302 can be configured to provide a primary light (e.g., blue light, white light, UV light, or a combination of blue light and UV light) that may be processed through LCD module 204 and subsequently, transmitted to and distributed across display screen 230. In some embodiments, LEDs 310 comprise blue LEDs that emit light having a peak emission wavelength between about 440 nm and about 470 nm, or between about 445 nm and about 455 nm. In some embodiments, LEDs 310 comprise white LEDs that emit light in the range from about 440 nm to about 700 nm or other possible light wavelength ranges. In some embodiments, LEDs 210 comprise UV LEDs that emit light having a peak emission wavelength that is less than 420 nm, or that is between about 400 nm and about 410 nm, or that is between about 360 nm and about 370 nm. According to an embodiment, the blue LED may be, for example, a GaN LED that emits blue light at a wavelength of 450 nm. LEDs 310 can be arranged in line that extends along, for example, the Y-axis.

LGP 312 can include fiber optic cables, polymeric or glass solid bodies such as plates, films, containers, or other structures, according to some embodiments. The size of LGP 312 can depend on the ultimate application and characteristics of LED 310. The thickness of LGP 312 can be compatible with thickness of LED 310. The other dimensions of LGP 312 can be designed to extend beyond the dimensions of LED 310, and may be on the order of 10's of millimeters, to 10's to 100's of centimeters.

In some embodiments, the materials of LGP 312 can include polycarbonate (PC), poly methyl methacrylate (PMMA), methyl methacrylate, styrene, acrylic polymer resin, glass, or other suitable LGP materials. Suitable manufacturing methods for LGP 312 can include injection molding, extrusion, or other suitable embodiments. LGP 312 can be configured to provide uniform primary light emission, such that primary light entering LCD module 204 can be of uniform color and brightness. LGP 312 can include a substantially uniform thickness over the entire LGP 312 surface. Alternatively, LGP 312 can have a wedge-like shape. In some embodiments, LGP 312 can be optically coupled to LED 310 and may be physically connected to or detached from LED 310. For physically connecting LGP 312 to LED 310, optically transparent adhesive may be used (not shown).

In some embodiments, BLU 302 can include an array of LEDs (not shown), each of which may be similar to LED 310 in structure and function. The array of LEDs may be adjacent to LGP 312 and may be configured to provide the primary light to LCD module 204 for processing and for subsequent transmission to display screen 230 as discussed above with reference to FIG. 2.

In some embodiments, reflector 308 can be configured to increase the amount of light that is emitted from LGP 312. Reflector 308 can comprise a suitable material, such as a reflective mirror, a film of reflector particles, a reflective metal film, or other suitable conventional reflectors. In some embodiments, reflector 308 can include a white film. In some embodiments, reflector 308 can include additional functionality or features, such as scattering, diffuser, or brightness-enhancing features.

Optical Effects of Adding Fluorescent Layer

Figure 4:
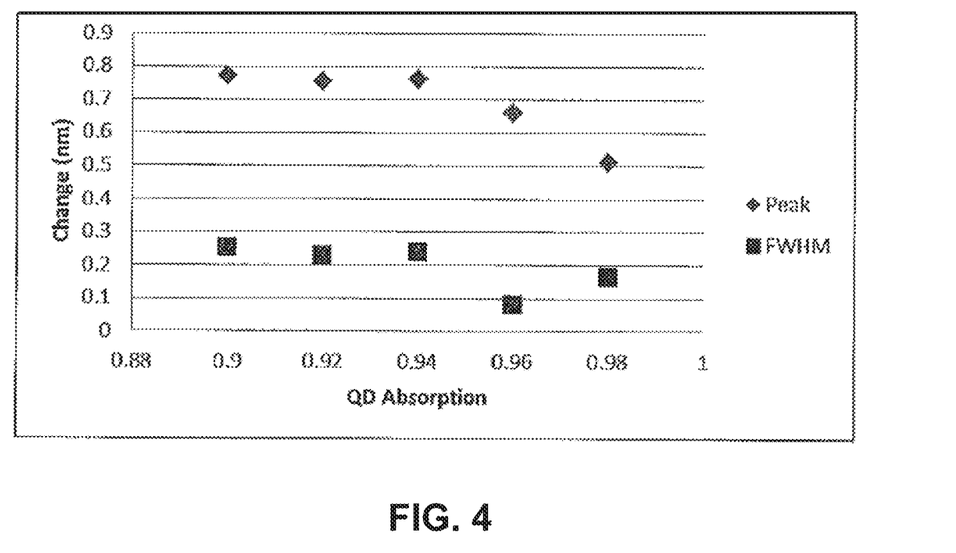
FIG. 4 is a graph illustrating the effect that adding fluorescent material has on the overall peak emission, according to an embodiment.

FIG. 4 illustrates a graph of data that shows insignificant change in overall peak emission and FWHM of a green sub-pixel when using a fluorescent dye layer having the properties of the example BODIPY 493/503 dye discussed above (assuming 99% absorption of any remaining blue light that has passed through the luminescent nanostructures.) The peak emission of the green sub-pixel changes by less than 1 nm for a range of absorption values from the luminescent nanostructures (e.g., quantum dots). Similarly, the FWHM of the emission spectra changes by less than 0.3 nm for the same range of absorption values from the luminescent nanostructures (e.g., quantum dots). This demonstrates that the inclusion of the fluorescent dye did not adversely affect the expected optical characteristics of the green sub-pixel.

Figure 5:
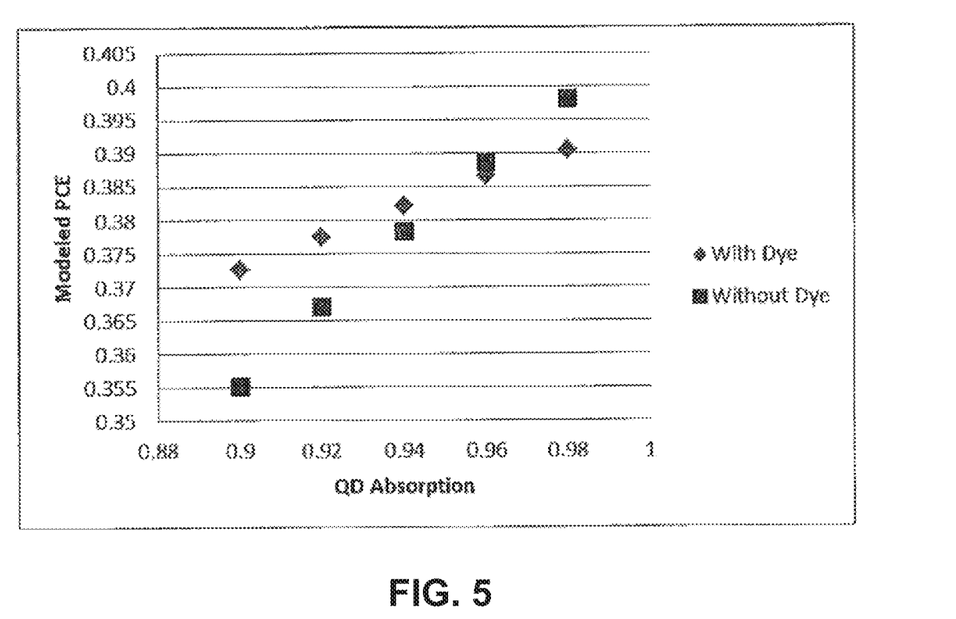
FIG. 5 is a graph illustrating the effect that adding fluorescent material has on the overall optical efficiency, according to an embodiment.

FIG. 5 illustrates a graph demonstrating the overall photon conversion efficiency (PCE) of the green sub-pixel both with and without a fluorescent dye layer having the properties of the example BODIPY 493/503 dye discussed above. The overall optical efficiency of the green sub-pixels is increased when using the fluorescent dye layer for quantum dot absorption values less than about 96%. Green indium-based quantum dots commonly demonstrate about a 92% absorbance rate of blue light when used in a layer thickness of about 6 micrometers.

Example Embodiments of a Barrier Layer Coated Nanostructure

Figure 6:
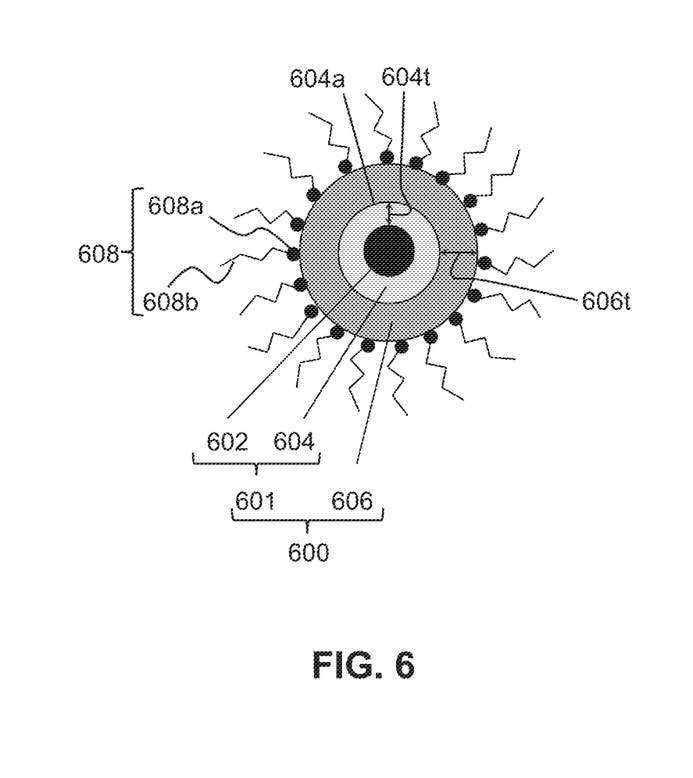
FIG. 6 is a schematic of a cross-sectional view of a nanostructure, according to an embodiment.

FIG. 6 illustrates a cross-sectional structure of a barrier layer coated luminescent nanostructure (NS) 600, according to an embodiment. A quantum dot is one example of NS 600. In some embodiments, a population of NS 600 can be included in layers of luminescent nanostructures 236. Barrier layer coated NS 600 includes a NS 601 and a barrier layer 606. NS 601 includes a core 602 and a shell 604. Core 602 includes a semiconducting material that emits light upon absorption of higher energies. Examples of the semiconducting material for core 602 include indium phosphide (InP), cadmium selenide (CdSe), zinc sulfide (ZnS), lead sulfide (PbS), indium arsenide (InAs), indium gallium phosphide, (InGaP), cadmium zinc selenide (CdZnSe), zinc selenide (ZnSe) and cadmium telluride (CdTe). Any other II-VI, III-V, tertiary, or quaternary semiconductor structures that exhibit a direct band gap may be used as well. In an embodiment, core 602 can also include one or more dopants such as metals, alloys, to provide some examples. Examples of metal dopant may include, but not limited to, zinc (Zn), Copper (Cu), aluminum (Al), platinum (Pt), chrome (Cr), tungsten (W), palladium (Pd), or a combination thereof. The presence of one or more dopants in core 602 can improve structural and optical stability and QY of NS 601 compared to undoped NSs.

Core 602 can have a size of less than 20 nm in diameter, according to an embodiment. In another embodiment, core 602 can have a size between about 1 nm and about 5 nm in diameter. The ability to tailor the size of core 602, and consequently the size of NS 601 in the nanometer range enables photoemission coverage in the entire optical spectrum. In general, the larger NSs emit light towards the red end of the spectrum, while smaller NSs emit light towards the blue end of the spectrum. This effect arises as larger NSs have energy levels that are more closely spaced than the smaller NSs. This allows the NS to absorb photons containing less energy, i.e. those closer to the red end of the spectrum.

Shell 604 surrounds core 602 and is disposed on outer surface of core 602. Shell 604 can include cadmium sulfide (CdS), zinc cadmium sulfide (ZnCdS), zinc selenide sulfide (ZnSeS), and zinc sulfide (ZnS). In an embodiment, shell 604 can have a thickness 604$t$, for example, one or more monolayers. In other embodiments, shell 604 can have a thickness 604$t$ between about 1 nm and about 5 nm. Shell 604 can be utilized to help reduce the lattice mismatch with core 602 and improve the QY of NS 601. Shell 604 can also help to passivate and remove surface trap states, such as dangling bonds, on core 602 to increase QY of NS 601. The presence of surface trap states may provide non-radiative recombination centers and contribute to lowered emission efficiency of NS 601.

In alternate embodiments, NS 601 can include a second shell disposed on shell 604, or more than two shells surrounding core 602, without departing from the spirit and scope of the present invention. In an embodiment, the second shell may be on the order of two monolayers thick and is typically, though not required, also a semiconducting material. Second shell may provide protection to core 602. Second shell material may be zinc sulfide (ZnS), although other materials may be used as well without deviating from the scope or spirit of the invention.

Barrier layer 606 is configured to form a coating on NS 601. In an embodiment, barrier layer 606 is disposed on and in substantial contact with outer surface 604$a$ of shell 604. In embodiments of NS 601 having one or more shells, barrier layer 606 can be disposed on and in substantial contact with the outermost shell of NS 601. In an example embodiment, barrier layer 606 is configured to act as a spacer between NS 601 and one or more NSs in, for example, a solution, a composition, and/or a film having a plurality of NSs, where the plurality of NSs may be similar to NS 601 and/or barrier layer coated NS 600. In such NS solutions, NS compositions, and/or NS films, barrier layer 606 can help to prevent aggregation of NS 601 with adjacent NSs. Aggregation of NS 601 with adjacent NSs may lead to increase in size of NS 601 and consequent reduction or quenching in the optical emission properties of the aggregated NS (not shown) including NS 601. In further embodiments, barrier layer 606 provides protection to NS 601 from, for example, moisture, air, and/or harsh environments (e.g., high temperatures and chemicals used during lithographic processing of NSs and/or during manufacturing process of NS based devices) that may adversely affect the structural and optical properties of NS 601.

Barrier layer 606 includes one or more materials that are amorphous, optically transparent and/or electrically inactive. Suitable barrier layers include inorganic materials, such as, but not limited to, inorganic oxides and/or nitrides. Examples of materials for barrier layer 606 include oxides and/or nitrides of Al, Ba, Ca, Mg, Ni, Si, Ti, or Zr, according to various embodiments. Barrier layer 606 can have a thickness 606$t$ ranging from about 8 nm to about 15 nm in various embodiments.

As illustrated in FIG. 6, barrier layer coated NS 600 can additionally or optionally include a plurality of ligands or surfactants 608, according to an embodiment. Ligands or surfactants 608 can be adsorbed or bound to an outer surface of barrier layer coated NS 600, such as on an outer surface of barrier layer 606, according to an embodiment. The plurality of ligands or surfactants 608 can include hydrophilic or polar heads 608$a$ and hydrophobic or non-polar tails 608$b$. The hydrophilic or polar heads 608$a$ may be bound to barrier layer 606. The presence of ligands or surfactants 608 can help to separate NS 600 and/or NS 601 from other NSs in, for example, a solution, a composition, and/or a film during their formation. If the NSs are allowed to aggregate during their formation, the quantum efficiency of NSs such as NS 600 and/or NS 601 can drop. Ligands or surfactants 608 can also be used to impart certain properties to barrier layer coated NS 600, such as hydrophobicity to provide miscibility in non-polar solvents, or to provide reaction sites (e.g., reverse micellar systems) for other compounds to bind.

A wide variety of ligands exist that may be used as ligands 608. In some embodiments, the ligand is a fatty acid selected from lauric acid, caproic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from dodecylamine, oleylamine, hexadecylamine, and octadecylamine. In some embodiments, the ligand is trioctylphosphine (TOP). In some embodiments, the ligand is oleylamine. In some embodiments, the ligand is diphenylphosphine.

A wide variety of surfactants exist that may be used as surfactants 608. Nonionic surfactants may be used as surfactants 608 in some embodiments. Some examples of nonionic surfactants include polyoxyethylene (5) nonylphenylether (commercial name IGEPAL CO-520), polyoxyethylene (9) nonylphenylether (IGEPAL CO-630), octylphenoxy poly(ethyleneoxy)ethanol (IGEPAL CA-630), polyethylene glycol oleyl ether (Brij 93), polyethylene glycol hexadecyl ether (Brij 52), polyethylene glycol octadecyl ether (Brij S10), polyoxyethylene (10) isooctylcyclohexyl ether (Triton X-100), and polyoxyethylene branched nonylcyclohexyl ether (Triton N-101).

Anionic surfactants may be used as surfactants 608 in some embodiments. Some examples of anionic surfactants include sodium dioctyl sulfosuccinate, sodium stearate, sodium lauryl sulfate, sodium monododecyl phosphate, sodium dodecylbenzenesulfonate, and sodium myristyl sulfate.

In some embodiments, NSs 601 and/or 600 can be synthesized to emit light in one or more various color ranges, such as red, orange, and/or yellow range. In some embodiments, NSs 601 and/or 600 can be synthesized to emit light in the green and/or yellow range. In some embodiments, NSs 601 and/or 600 can be synthesized emit light in the blue, indigo, violet, and/or ultra-violet range. In some embodiments, NSs 601 and/or 600 can be synthesized to have a primary emission peak wavelength between about 605 nm and about 650 nm, between about 510 nm and about 550 nm, or between about 300 nm and about 480 nm.

NSs 601 and/or 600 can be synthesized to display a high QY. In some embodiments, NSs 601 and/or 600 can be synthesized to display a QY between 80% and 95% or between 85% and 90%.

Thus, according to various embodiments, NSs 600 can be synthesized such that the presence of barrier layer 606 on NSs 601 does not substantially change or quench the optical emission properties of NSs 601.

Example Embodiments of a Nanostructure Film

Figure 7:
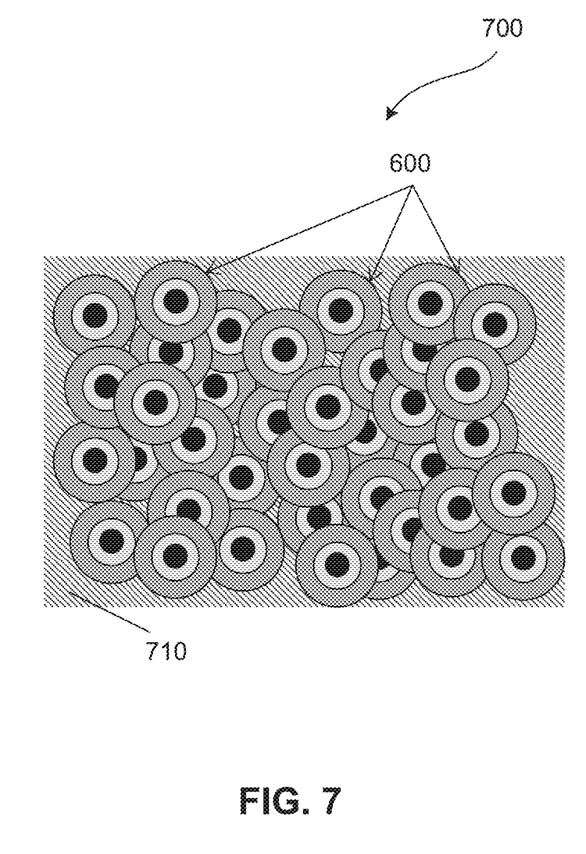
FIG. 7 is a schematic of a nanostructure film, according to an embodiment.

FIG. 7 illustrates a cross-sectional view of a NS film 700, according to an embodiment. In some embodiments, layers of luminescent nanostructures 236 can be similar to NS film 700.

NS film 700 can include a plurality of barrier layer coated core-shell NSs 600 (FIG. 6) and a matrix material 710, according to an embodiment. NSs 600 can be embedded or otherwise disposed in matrix material 710, according to some embodiments. As used herein, the term "embedded" is used to indicate that the NSs are enclosed or encased within matrix material 710 that makes up the majority component of the matrix. It should be noted that NSs 600 can be uniformly distributed throughout matrix material 710 in an embodiment, though in other embodiments NSs 600 can be distributed according to an application-specific uniformity distribution function. It should be noted that even though NSs 600 are shown to have the same size in diameter, a person skilled in the art would understand that NSs 600 can have a size distribution.

In an embodiment, NSs 600 can include a homogenous population of NSs having sizes that emit in the blue visible wavelength spectrum, in the green visible wavelength spectrum, or in the red visible wavelength spectrum. In other embodiments, NSs 600 can include a first population of NSs having sizes that emit in the blue visible wavelength spectrum, a second population of NSs having sizes that emit in the green visible wavelength spectrum, and a third population of NSs that emit in the red visible wavelength spectrum.

Matrix material 710 can be any suitable host matrix material capable of housing NSs 600. Suitable matrix materials may be chemically and optically compatible with NSs 600 and any surrounding packaging materials or layers used in applying NS film 700 to devices. Suitable matrix materials may include non-yellowing optical materials that are transparent to both the primary and secondary light, thereby allowing for both primary and secondary light to transmit through the matrix material. In an embodiment, matrix material 710 can completely surround each of the NSs 600. The matrix material 710 can be flexible in applications where a flexible or moldable NS film 700 is desired. Alternatively, matrix material 710 can include a high-strength, non-flexible material.

Matrix material 710 can include polymers and organic and inorganic oxides. Suitable polymers for use in matrix material 710 can be any polymer known to the ordinarily skilled artisan that can be used for such a purpose. The polymer may be substantially translucent or substantially transparent. Matrix material 710 can include, but not limited to, epoxies, acrylates, norbornene, polyethylene, poly(vinyl butyral):poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are crosslinked with bifunctional monomers, such as divinylbenzene; cross-linkers suitable for cross-linking ligand materials, epoxides that combine with ligand amines (e.g., APS or PEI ligand amines) to form epoxy, and the like.

In some embodiments, matrix material 710 includes scattering microbeads such as TiO2 microbeads, ZnS microbeads, or glass microbeads that may improve photo conversion efficiency of NS film 700. In some embodiments, matrix material 710 can include fluorescent material such as the fluorescent dyes described above in fluorescent layers 238 with reference to FIGS. 2-3.

In another embodiment, matrix material 710 can have low oxygen and moisture permeability, exhibit high photo- and chemical-stability, exhibit favorable refractive indices, and adhere to outer surfaces of NSs 600, thus providing an air-tight seal to protect NSs 600. In another embodiment, matrix material 710 can be curable with UV or thermal curing methods to facilitate roll-to-roll processing.

According to some embodiments, NS film 700 can be formed by mixing NSs 600 in a polymer (e.g., photoresist) and casting the NS-polymer mixture on a substrate, mixing NSs 600 with monomers and polymerizing them together, mixing NSs 600 in a sol-gel to form an oxide, or any other method known to those skilled in the art.

According to some embodiments, the formation of NS film 700 can include a film extrusion process. The film extrusion process may include forming a homogenous mixture of matrix material 710 and barrier layer coated core-shell NSs such as NS 600, introducing the homogenous mixture into a top mounted hopper that feeds into an extruder. In some embodiments, the homogenous mixture may be in the form of pellets. The film extrusion process may further include extruding NS film 700 from a slot die and passing extruded NS film 700 through chill rolls. In some embodiments, the extruded NS film 700 can have a thickness less than about 75 μm, for example, in a range from about 70 μm to about 40 μm, from about 65 μm to about 40 μm, from about 60 μm to about 40 μm, or form about 50 μm to about 40 μm. In some embodiments, NS film 700 has a thickness less than about 10 μm. In some embodiments, the formation of NS film 700 can optionally include a secondary process followed by the film extrusion process. The secondary process may include a process such as co-extrusion, thermoforming, vacuum forming, plasma treatment, molding, and/or embossing to provide a texture to a top surface of NS film 700. The textured top surface NS film 700 can help to improve, for example defined optical diffusion property and/or defined angular optical emission property of NS film 700.

Example Embodiments of Luminescent Nanostructures

Described herein are various compositions having luminescent nanostructures (NSs). The various properties of the luminescent nanostructures, including their absorption properties, emission properties and refractive index properties, may be tailored and adjusted for various applications.

The material properties of NSs may be substantially homogenous, or in certain embodiments, may be heterogeneous. The optical properties of NSs may be determined by their particle size, chemical or surface composition. The ability to tailor the luminescent NS size in the range between about 1 nm and about 15 nm may enable photoemission coverage in the entire optical spectrum to offer great versatility in color rendering. Particle encapsulation may offer robustness against chemical and UV deteriorating agents.

Luminescent NSs, for use in embodiments described herein may be produced using any method known to those skilled in the art. Suitable methods and example nanocrystals are disclosed in U.S. Pat. No. 7,374,807; U.S. patent application Ser. No. 10/796,832, filed Mar. 10, 2004; U.S. Pat. No. 6,949,206; and U.S. Provisional Patent Application No. 60/578,236, filed Jun. 8, 2004, the disclosures of each of which are incorporated by reference herein in their entireties.

Luminescent NSs for use in embodiments described herein may be produced from any suitable material, including an inorganic material, and more suitably an inorganic conductive or semiconductive material. Suitable semiconductor materials may include those disclosed in U.S. patent application Ser. No. 10/796,832, and may include any type of semiconductor, including group II-VI, group III-V, group IV-VI and group IV semiconductors. Suitable semiconductor materials may include, but are not limited to, Si, Ge, Sn, Se, Te, B, C (including diamond), P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTe, BeS, BeSe, BeTe, MgS, MgSe, GeS, GeSe, GeTe, SuS, SnSe, SnTe, PbO, PbS, PbSe, PbTe, CuF, CuCl, CuBr, CuI, $Si_3N_4$, $Ge_3N_4$, $Al_2O_3$, $(Al, Ga, In)_2 (S, Se, Te)_3$, $Al_2CO$, and an appropriate combination of two or more such semiconductors.

In certain embodiments, the luminescent NSs may have a dopant from the group consisting of a p-type dopant or an n-type dopant. The NSs may also have II-VI or III-V semiconductors. Examples of II-VI or III-V semiconductor NSs may include any combination of an element from Group II, such as Zn, Cd and Hg, with any element from Group VI, such as S, Se, Te and Po, of the Periodic Table; and any combination of an element from Group III, such as B, Al, Ga, In, and Tl, with any element from Group V, such as N, P, As, Sb and Bi, of the Periodic Table.

The luminescent NSs, described herein may also further include ligands conjugated, cooperated, associated or attached to their surface. Suitable ligands may include any group known to those skilled in the art, including those disclosed in U.S. Pat. No. 8,283,412; U.S. Patent Publication No. 2008/0237540; U.S. Patent Publication No. 2010/0110728; U.S. Pat. Nos. 8,563,133; 7,645,397; 7,374,807; 6,949,206; 7,572,393; and 7,267,875, the disclosures of each of which are incorporated herein by reference. Use of such ligands may enhance the ability of the luminescent NSs to incorporate into various solvents and matrixes, including polymers. Increasing the miscibility (i.e., the ability to be mixed without separation) of the luminescent NSs in various solvents and matrixes may allow them to be distributed throughout a polymeric composition such that the NSs do not aggregate together and therefore do not scatter light. Such ligands are described as "miscibility-enhancing" ligands herein.

In certain embodiments, compositions having luminescent NSs distributed or embedded in a matrix material are provided. Suitable matrix materials may be any material known to the ordinarily skilled artisan, including polymetic materials, organic and inorganic oxides. Compositions described herein may be layers, encapsulants, coatings, sheets or films. It should be understood that in embodiments described herein where reference is made to a layer, polymeric layer, matrix, sheet or film, these terms are used interchangeably, and the embodiment so described is not limited to any one type of composition, but encompasses any matrix material or layer described herein or known in the art.

Down-converting NSs (for example, as disclosed in U.S. Pat. No. 7,374,807) utilize the emission properties of luminescent nanostructures that are tailored to absorb light of a particular wavelength and then emit at a second wavelength, thereby providing enhanced performance and efficiency of active sources (e.g., LEDs).

While any method known to the ordinarily skilled artisan may be used to create luminescent NSs, a solution-phase colloidal method for controlled growth of inorganic nanomaterial phosphors may be used. See Alivisatos, A. P., "Semiconductor clusters, nanocrystals, and quantum dots," Science 271:933 (1996); X. Peng, M. Schlamp, A. Kadavanich, A. P. Alivisatos, "Epitaxial growth of highly luminescent CdSe/CdS Core/Shell nanocrystals with photostability and electronic accessibility," J. Am. Chem. Soc. 30:7019-7029 (1997); and C. B. Murray, D. J. Norris, M. G. Bawendi, "Synthesis and characterization of nearly monodisperse CdE (E=sulfur, selenium, tellurium) semiconductor nanocrystallites," J Am. Chem. Soc. 115:8706 (1993), the disclosures of which are incorporated by reference herein in their entireties.

According to an embodiment, CdSe may be used as the NS material, in one example, for visible light down-conversion, due to the relative maturity of the synthesis of this material. Due to the use of a generic surface chemistry, it may also possible to substitute non-cadmium-containing NSs.

In semiconductor NSs, photo-induced emission arises from the band edge states of the NS. The band-edge emission from luminescent NSs competes with radiative and non-radiative decay channels originating from surface electronic states. X. Peng, et al., J Am. Chem. Soc. 30:7019-7029 (1997). As a result, the presence of surface defects such as dangling bonds provide non-radiative recombination centers and contribute to lowered emission efficiency. An efficient and permanent method to passivate and remove the surface trap states may be to epitaxially grow an inorganic shell material on the surface of the NS. X. Peng, et al., J. Am. Chem. Soc. 30:701 9-7029 (1997). The shell material may be chosen such that the electronic levels are type 1 with respect to the core material (e.g., with a larger bandgap to provide a potential step localizing the electron and hole to the core). As a result, the probability of non-radiative recombination may be reduced.

Core-shell structures may be obtained by adding organometallic precursors containing the shell materials to a reaction mixture containing the core NSs. In this case, rather than a nucleation event followed by growth, the cores act as the nuclei, and the shells may grow from their surface. The temperature of the reaction is kept low to favor the addition of shell material monomers to the core surface, while preventing independent nucleation of nanocrystals of the shell materials. Surfactants in the reaction mixture are present to direct the controlled growth of shell material and to ensure solubility. A uniform and epitaxially grown shell may be obtained when there is a low lattice mismatch between the two materials.

Example materials for preparing core-shell luminescent NSs may include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdTe, HgS, HgSe, HgTc, BeS, BcSe, BcTe, MgS, MgSe, GeS, GeSe, GeTe, SnS, SnSe, SnTe, PbO, PbS, PbSe, PbTe, CuP, CuCl, CuBr, CuI, Si$_3$N$_4$, Ge$_3$N$_4$, Al$_2$O$_3$, (Al, Ga, In)$_2$ (S, Se, Te)$_3$, AlCO, and shell luminescent NSs for use in the practice of the present invention include, but are not limited to, (represented as Core/Shell), CdSe/ZnS, InP/ZnS, InP/ZnSe, PbSe/PbS, CdSe/CdS, CdTe/CdS, CdTe/ZnS, as well as others.

Luminescent NSs for use in the embodiments described herein may be less than about 100 nm in size, and down to less than about 2 nm in size and invention absorb visible light. As used herein, visible light is electromagnetic radiation with wavelengths between about 380 and about 780 nanometers that is visible to the human eye. Visible light can be separated into the various colors of the spectrum, such as red, orange, yellow, green, blue, indigo and violet. Blue light may comprise light between about 435 nm and about 495 nm, green light may comprise light between about 495 nm and 570 nm and red light may comprise light between about 620 nm and about 750 nm in wavelength.

According to various embodiments, the luminescent NSs may have a size and a composition such that they absorb photons that are in the ultraviolet, near-infrared, and/or infrared spectra. The ultraviolet spectrum may comprise light between about 100 nm to about 400 nm, the near-infrared spectrum may comprise light between about 750 nm to about 100 µm in wavelength, and the infrared spectrum may comprise light between about 750 nm to about 300 µm in wavelength.

While luminescent NSs of other suitable material may be used in the various embodiments described herein, in certain embodiments, the NSs may be ZnS, InAs, CdSe, or any combination thereof to form a population of nanocrystals for use in the embodiments described herein. As discussed above, in further embodiments, the luminescent NSs may be core/shell nanocrystals, such as CdSe/ZnS, InP/ZnSe, CdSe/CdS or InP/ZnS.

Suitable luminescent nanostructures, methods of preparing luminescent nanostructures, including the addition of various solubility-enhancing ligands, can be found in Published U.S. Patent Publication No. 2012/0113672, the disclosure of which is incorporated by reference herein in its entirety.

It is to be understood that while certain embodiments have been illustrated and described herein, the claims are not to be limited to the specific forms or arrangement of parts described and shown. In the specification, there have been disclosed illustrative embodiments and, although specific terms are employed, they are used in a generic and descriptive sense only and not for purposes of limitation. Modifications and variations of the embodiments are possible in light of the above teachings. It is therefore to be understood that the embodiments may be practiced otherwise than as specifically described.

What is claimed is:

1. A display device comprising:
a backlight unit comprising a light source configured to emit a primary light in a first wavelength region of an electromagnetic (EM) spectrum; and
a liquid crystal display (LCD) module comprising a pixel having:
a first sub-pixel comprising:
a first layer of luminescent nanostructures, the luminescent nanostructures being configured to absorb the primary light and emit a second light in a second wavelength region of the EM spectrum different from the first wavelength region, and
a first layer of fluorescent material configured to absorb the primary light that has passed through the first layer of luminescent nanostructures, and to emit a third light in the second wavelength region of the EM spectrum; and
a second sub-pixel comprising:
a second layer of luminescent nanostructures configured to emit a fourth light in a third wavelength region of the EM spectrum different from the first and second wavelength regions, and
a second layer of fluorescent material configured to absorb the primary light that has passed through the second layer of luminescent nanostructures, and to emit a fifth light in the third wavelength region of the EM spectrum,
wherein the first and second layers of fluorescent material are different regions of a continuous film.

2. The display device of claim 1, wherein the first layer of luminescent nanostructures comprises a layer of quantum dots (QDs).

3. The display device of claim 1, wherein the first layer of luminescent nanostructures is configured to emit visible green or red light.

4. The display device of claim 1, wherein the first layer of fluorescent material comprises a dye.

5. The display device of claim 1, wherein the first layer of fluorescent material is disposed directly on the first layer of luminescent nanostructures.

6. The display device of claim 1, wherein the first layer of fluorescent material has a thickness less than 10 µm.

7. The display device of claim 1, wherein the LCD module further comprises:
a third sub-pixel configured to emit a sixth light in the first wavelength region of the EM spectrum, wherein the sixth light is visible blue light.

8. A luminescent device, comprising:
a light source configured to emit a primary light in a first wavelength region of an electromagnetic (EM) spectrum;
a first film comprising luminescent nanostructures configured to absorb the primary light and emit a second light in a second wavelength region of the EM spectrum different from the first wavelength region;
a second film disposed on the first film and comprising fluorescent material configured to absorb the primary light that has passed through the first film, and to emit a third light in the second wavelength region of the EM spectrum;
a third film comprising luminescent nanostructures configured to absorb the primary light and emit a fourth light in a third wavelength region of the EM spectrum different from the first and second wavelength regions; and
a fourth film disposed on the third film and comprising fluorescent material configured to absorb the primary light that has passed through the third film, and to emit a fifth light in the third wavelength region of the EM spectrum,
wherein the second and fourth films are different regions of a continuous film.

9. The luminescent device of claim 8, wherein the first film comprising luminescent nanostructures comprises a layer of quantum dots (QDs).

10. The luminescent device of claim 8, wherein the first film comprising luminescent nanostructures is configured to emit visible green or red light.

11. The luminescent device of claim 8, wherein the fluorescent material in the second film comprises a dye.

12. The luminescent device of claim 8, wherein the second film has a thickness less than 10 µm.

13. A display device comprising an array of pixels, a pixel of the array of the pixels comprising:
- a first sub-pixel having:
  - a first layer of luminescent nanostructures, the luminescent nanostructures being configured to absorb primary light in a first wavelength region of an electromagnetic (EM) spectrum and to emit a second light in a second wavelength region of the EM spectrum different from the first wavelength region, and
  - a first layer of fluorescent material configured to absorb the primary light that has passed through the first layer of luminescent nanostructures, and to emit a third light in the second wavelength region of the EM spectrum; and
- a second sub-pixel comprising:
  - a second layer of luminescent nanostructures configured to emit a fourth light in a third wavelength region of the EM spectrum different from the first and second wavelength regions, and
  - a second layer of fluorescent material configured to absorb the primary light that has passed through the second layer of luminescent nanostructures, and to emit a fifth light in the third wavelength region of the EM spectrum,
- wherein the first and second layers of fluorescent material are different regions of a continuous film.

14. The display device of claim 13, wherein the first layer of luminescent nanostructures comprises a layer of quantum dots (QDs).

15. The display device of claim 13, wherein the first layer of luminescent nanostructures is configured to emit visible green or red light.

16. The display device of claim 13, wherein the first layer of fluorescent material comprises a dye.

17. The display device of claim 13, wherein the first layer of fluorescent material has a thickness less than 10 μm.

* * * * *